United States Patent [19]
Schoenherr et al.

[11] Patent Number: 5,215,589
[45] Date of Patent: Jun. 1, 1993

[54] HIGH-VACUUM COATING APPARATUS

[75] Inventors: Bernhard Schoenherr, Offenbach; Karl-Heinrich Wenk, Bad Nauheim, both of Fed. Rep. of Germany

[73] Assignee: Leybold Aktiengesellschaft, Hanau, Fed. Rep. of Germany

[21] Appl. No.: 915,908

[22] Filed: Jul. 15, 1992

[30] Foreign Application Priority Data

Mar. 10, 1992 [DE] Fed. Rep. of Germany ....... 4207526

[51] Int. Cl.$^5$ .............................................. C23C 14/00
[52] U.S. Cl. .................................... 118/720; 118/715; 118/718; 118/717; 118/726; 118/729
[58] Field of Search ............... 118/720, 715, 718, 719, 118/726, 729

[56] References Cited

U.S. PATENT DOCUMENTS 4,953,497  9/1990  Kessler .................................. 118/718
4,962,725 10/1990  Heinz ................................... 118/718

Primary Examiner—Richard Bueker
Attorney, Agent, or Firm—Felfe & Lynch

[57] ABSTRACT

A high-vacuum coating apparatus for coating films has beneath its coating cylinder (7) a pivoting unit (8) which can turn on a pivot shaft (25). It has an adjustable mask (29) and thereunder a shutter (28) which can run from a position covering an evaporator to a position releasing it. Due to its ability to turn, the pivoting unit (8) together with its parts can easily be cleaned.

5 Claims, 4 Drawing Sheets

HIGH-VACUUM COATING APPARATUS

The invention relates to a high-vacuum coating apparatus for coating a film which is carried in an evacuable vacuum tank over a coating cylinder disposed when in the working position above an evaporator and able to be rolled out the vacuum tank by a floor running unit, and in which, in order to define the coating area, an adjustable mask defining the coating area is disposed beneath the coating cylinder, plus a movable shutter for the complete covering of the evaporator.

Coating apparatus of the above kind are used for coating films with a metal overlay and are generally known. They have a floor running unit running on tracks, which can be brought with a tank plate sealingly against an open end face of the vacuum tank. A winder, an unwinder and a coating cylinder extend out of the tank plate. When this coating cylinder enters into the vacuum tank it comes over the evaporator stationarily mounted in the vacuum tank.

The shutter which covers the evaporator before and after the coating process is, in the known apparatus, disposed on the evaporator in the vacuum tank and therefore is not easily accessible for cleaning. The mask is provided on the floor running unit so as to be able to swing under the coating cylinder, but it is nevertheless poorly accessible, since even in the state in which it is swung away from the coating cylinder it is in an undesirably low, poorly accessible position.

The invention is addressed to the problem of improving a high-vacuum coating apparatus of the kind described above such that, when it is open, its mask and shutter will be very easily accessible for cleaning.

This problem is solved according to the invention in that the mask and the shutter are provided on a pivoting unit which is hinged parallel to the coating cylinder, in front of the latter, on the floor-running unit.

By this combining of the shutter and mask in a single turning unit, and by the fact that its pivot shaft is in front of the coating cylinder, the shutter and the mask can be turned to a position in which the surfaces to be cleaned are easily accessible.

The pivoting unit is of especially compact construction and makes optimum use of the space available in the high-vacuum coating apparatus if, according to a further development of the invention, the shutter is disposed to travel on straight guides on the pivoting unit.

After being turned away from the coating cylinder, the pivoting unit is at a sufficient distance away from it to be easily accessible as well, and to permit cleaning of the coating cylinder if, according to another embodiment of the invention, the pivoting unit is L-shaped as seen from the side, and the pivot shaft in front of the coating cylinder is in the shorter limb of the L.

The vacuum tanks of known high-vacuum coating apparatus were heretofore always round in cross section, and the evaporator was always on about the vertical center line of the vacuum tank. The winders and unwinders were at a level above the evaporator to the right and left of it, so that the coating cylinder could be disposed between them directly above the evaporator. Thus the coating cylinder and accordingly also the mask carried by the floor-running unit were at a relatively great distance from the front of the apparatus, which made access difficult. The coating cylinder with the mask and shutter are optimally accessible if, according to an especially advantageous further improvement of the invention, the vacuum tank has a rectangular cross section and the evaporator and therefore also the coating cylinder is disposed off-center near the front wall of the vacuum tank, and if the pivot shaft runs between the coating cylinder and the front wall of the vacuum tank.

Usually in high-vacuum coating apparatus an airlock is formed above the coating cylinder by means of airlock jaws, and permits the achievement of a very high vacuum in the coating chamber. These airlock jaws can be integrated into the pivoting unit if, according to another further improvement of the invention, the pivot unit has two longitudinal rails 30 running parallel to one another at a distance apart, which, when the pivoting unit is swung under the coating cylinder, reaches with an arcuately curved surface directly facing the coating cylinder to form a sealing gap.

The invention is susceptible of numerous forms of embodiment. For a better comprehension of its basic principle, one of them is represented in the drawing and is described below.

BRIEF DESCRIPTION OF THE DRAWINGS

Referring now to the drawings:

FIG. 1 shows a vacuum tank 1 of rectangular cross section in which the coating process takes place. On the right above the vacuum tank 1 is a floor-running unit 2 which can run on rails 3. The floor-running unit 2 has a tank plate 4 which, by running the floor-running unit 2 leftward can be set sealingly against the right end of the vacuum tank 1. A winder 5 and an unwinder 6 extend from the tank plate 4 toward the vacuum tank 1. Furthermore, at a level about half-way between the winder 5 and unwinder 6 is shown a coating cylinder 7 and below it a pivoting unit 8. Winding motors 9 and 10 on the side of the tank plate 4 facing away from the vacuum tank 1 serve for driving the winder 5 and unwinder 6. A bearing plate 11 on the side of the floor-running unit 2 facing the vacuum tank 1 carries the ends of the winder 5 and unwinder 6 remote from the tank plate 4. To prevent the floor-running unit 2 from tipping due to the masses disposed in front of its tank plate 4 in FIG. 1, the floor-running unit 2 is supported at its frontmost and topmost point facing the vacuum tank 1 by wheels 12 on a beam 13 extending from the top of the vacuum tank 1.

Figure 1:
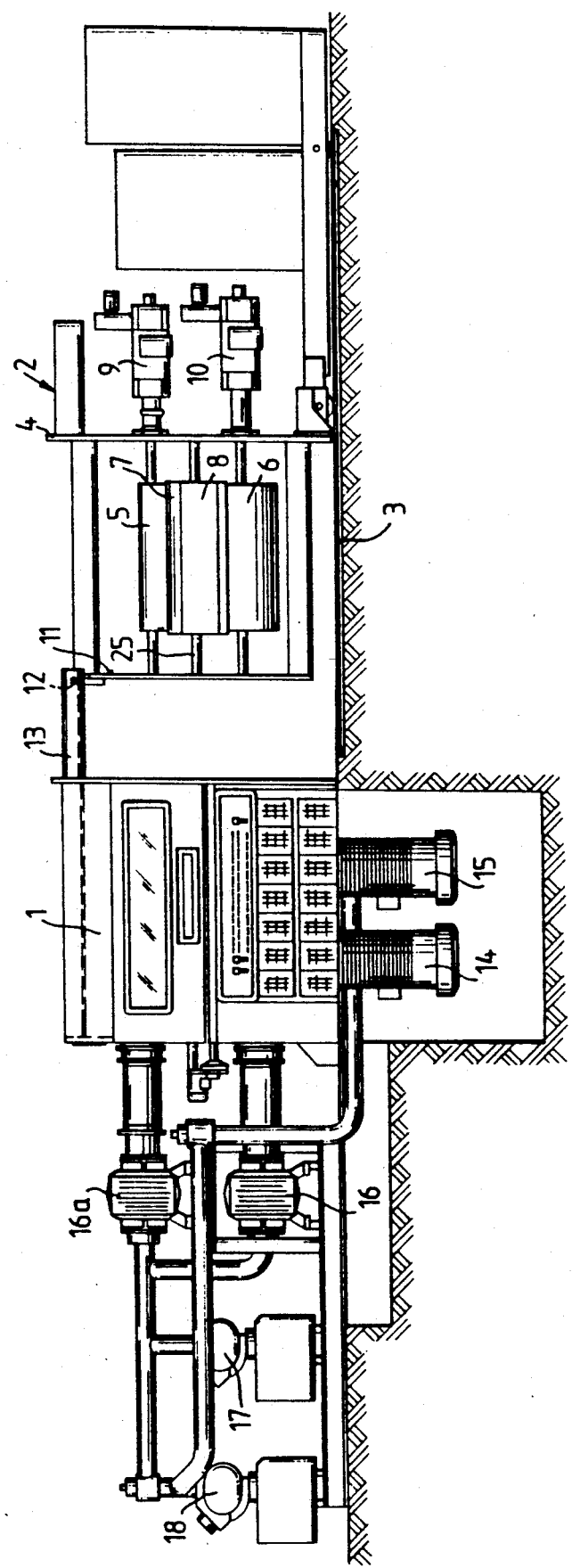
FIG. 1 is a side view of a high-vacuum coating apparatus according to the invention.

Two diffusion pumps 14 and 15 are disposed underneath the vacuum tank for the evacuation of the vacuum tank 1. Also, a set of mechanical pumps 16, 16a, 17 and 18 is situated in back of the vacuum tank. At the start of a coating process a roll of the film to be coated is pushed onto the winder 5 and the film 20 is then guided over pulley rolls not shown and the coating cylinder 7 to the winder 5. Then the floor-running unit 2 is rolled into the vacuum tank 1 until its tank plate 4 closes the vacuum tank 1. Then the vacuum tank is evacuated by the mechanical pumps 16–18 and part of it by the diffusion pumps 14 and 15.

Figure 2:
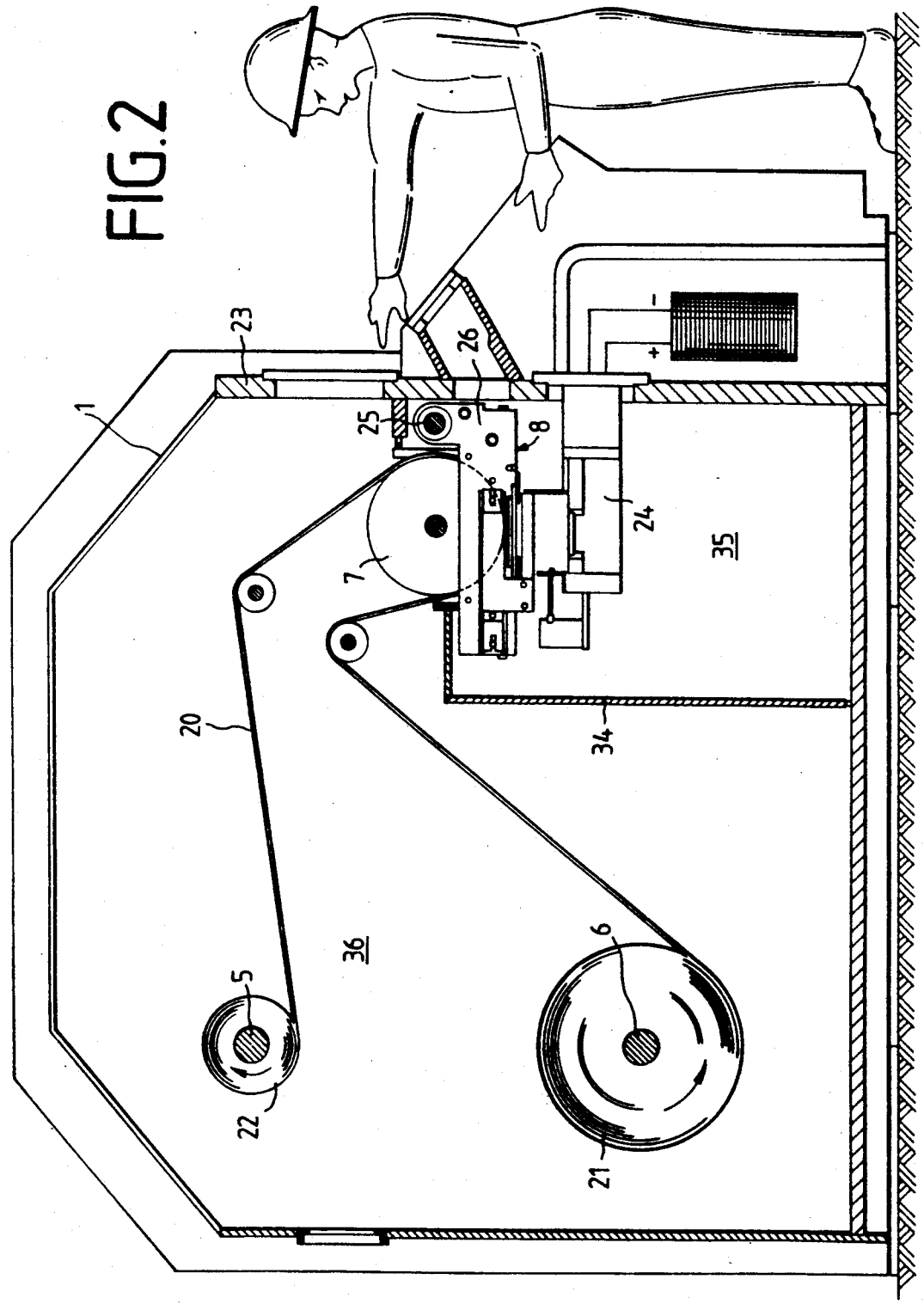
FIG. 2 is a diagrammatic cross section through a vacuum tank of the coating apparatus.

FIG. 2 shows diagrammatically in the vacuum tank 1, the unwinder 6 and above it the winder 5. Also it can be seen that the coating cylinder 7 is situated in front of the winder 5 and the unwinder 6 at a level about halfway between the two. The film 20 that is to be coated runs from a supply roll 21 on the unwinder 6, over the coating cylinder 7, to a take-up roll 22 on the winder 5.

On the front wall 23 of the vacuum tank 1 there is disposed adjacent its front wall 23 an evaporator 24. From the latter the coating material evaporates against a coating area of the film 20 on the coating cylinder 7, passing through the pivoting unit 8. The latter is approximately L-shaped and is hinged about a pivot shaft 25 running directly behind the front wall 23 of the vacuum tank 1 in front of the coating cylinder 7 through the shorter leg 26 of the L. FIG. 2 furthermore shows a dividing wall 34 which divides the vacuum tank 1 into a coating chamber 35 and a winding chamber 36.

Figure 3:
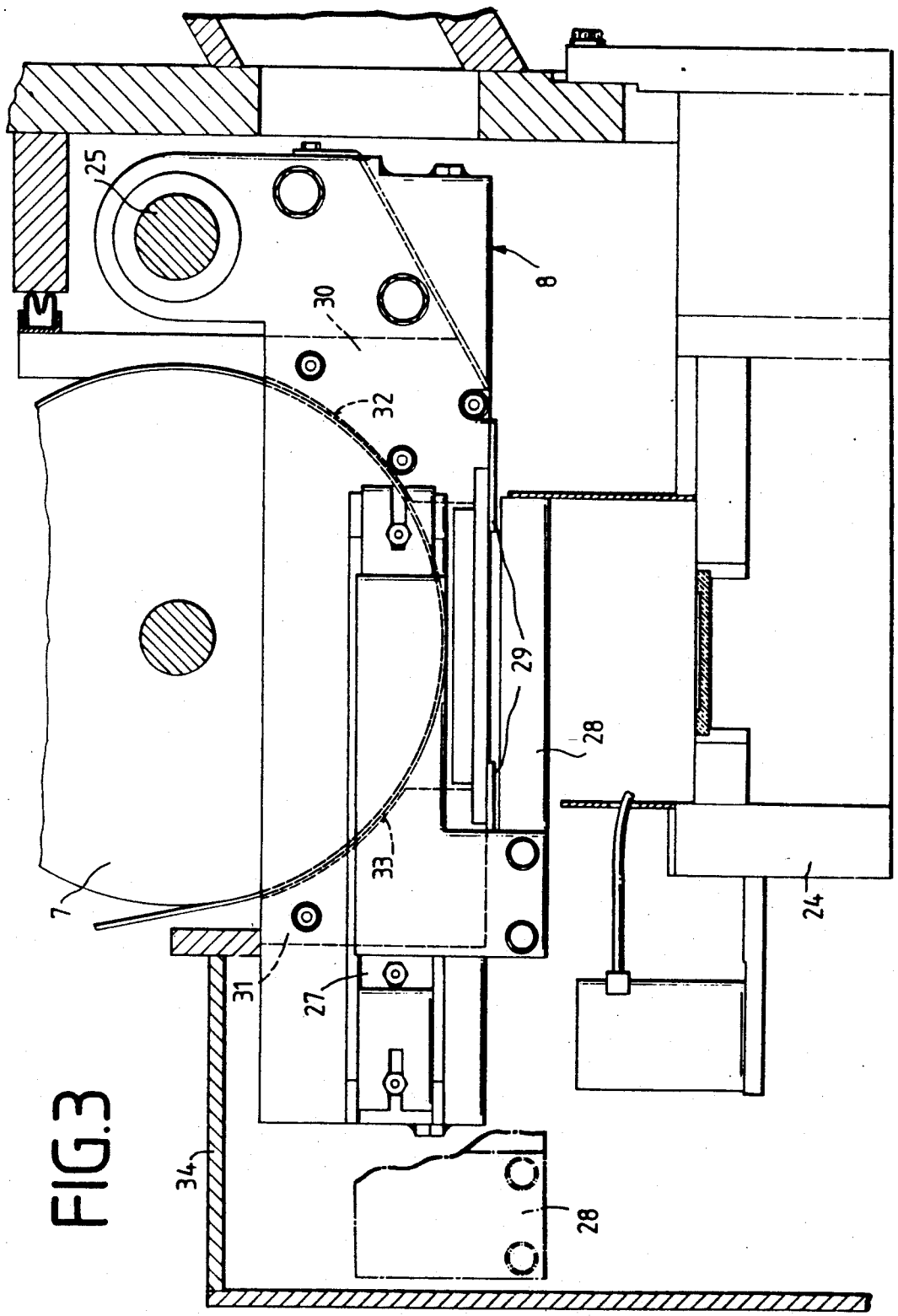
FIG. 3 is a representation on a larger scale than in FIG. 2 of the coating cylinder with the adjacent components.

FIG. 3 shows that the pivoting unit 8 has a shutter 28 which can run on a rectilinear guide 27 and which in the position represented covers the top of the evaporator 24. Above the shutter 28 can be seen two side parts of a mask 29 which defines the cross section of the passage of the evaporated metal toward the coating cylinder 7.

Two longitudinal legs 30 and 31 of the pivoting unit 8 are represented in broken lines in FIG. 3, each having a surface 32, 33, of circular curvature directly facing the coating cylinder 7 with which it forms a narrow air gap. These legs 30 and 31 form an airlock through which the flow of air from the winding chamber 36 shown in FIG. 2 to the coating chamber 35 is limited.

The rearward position of the shutter 28, in which the evaporator 24 is free and the coating process is running, is indicated in broken lines in FIG. 3.

Figure 4:
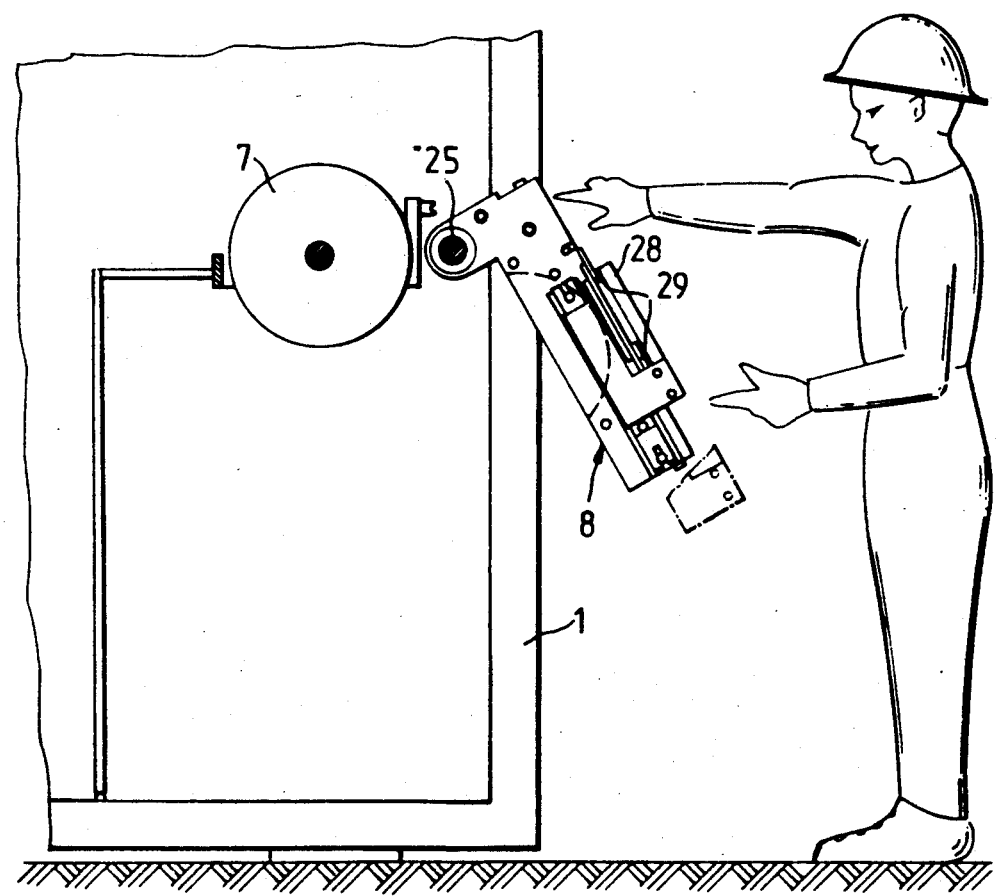
FIG. 4 is a cross section through a portion of the vacuum tank with a pivoting unit swung out.

FIG. 4 shows the pivoting unit 8 in its position swung away from the coating cylinder 7, which of course is possible only when the floor-running unit 2 with the coating cylinder is rolled out of the vacuum tank 1. It can be seen that, in this position the shutter 28 and the mask 29 are easily accessible.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. High-vacuum coating apparatus for coating a film comprising: an evacuable vacuum tank, an evaporator, a coating cylinder, the evacuable vacuum tank being over the coating cylinder which is disposed in working position above the evaporator and is movable out of the vacuum tank, a floor-running unit for moving the coating cylinder and including an adjustable mask, defining the coating area, which is disposed underneath the coating cylinder and a displaceable shutter for the complete covering of the evaporator, a pivot shaft disposed parallel to and in front of the coating cylinder of the floor-running unit, a pivoting unit which is hinged about the pivot shaft, the mask and the shutter being on the pivoting unit.

2. High-vacuum coating apparatus according to claim 1, in which the pivoting unit includes rectilinear guides and in which the shutter is disposed for running on the rectilinear guides.

3. High-vacuum coating apparatus according to claim 1, in which the pivoting unit is L-shaped having a shorter limb as seen from the side and in which the pivot shaft runs in front of the coating cylinder in the shorter limb of the L.

4. High-vacuum coating apparatus according to claim 1, in which the vacuum tank has a rectangular cross section and a front wall, and the evaporator and the coating cylinder are disposed off-center near the front wall of the vacuum tank, and in which the pivot shaft runs between the coating cylinder and the front wall of the vacuum tank.

5. High-vacuum coating apparatus according to claim 1, in which the pivoting unit has two longitudinal rails running parallel to one another at a distance apart, and in which, when the pivoting unit is swung under the coating cylinder, each rail has an arcuately curved surface which reaches to immediately in front of the coating cylinder with the formation of a narrow gap.

* * * * *